United States Patent
Cho et al.

(10) Patent No.: US 12,550,539 B2
(45) Date of Patent: Feb. 10, 2026

(54) DISPLAY DEVICE

(71) Applicant: Samsung Display Co., Ltd., Yongin-si (KR)

(72) Inventors: Kyong-Hun Cho, Suwon-si (KR); Guanghai Jin, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 541 days.

(21) Appl. No.: 18/113,332

(22) Filed: Feb. 23, 2023

(65) Prior Publication Data

US 2024/0008314 A1    Jan. 4, 2024

(30) Foreign Application Priority Data

Jul. 1, 2022  (KR) .................. 10-2022-0081239

(51) Int. Cl.
*H10K 59/122* (2023.01)
*H10K 59/12* (2023.01)
*H10K 59/35* (2023.01)
*H10K 59/80* (2023.01)

(52) U.S. Cl.
CPC ....... *H10K 59/122* (2023.02); *H10K 59/1201* (2023.02); *H10K 59/353* (2023.02); *H10K 59/80522* (2023.02)

(58) Field of Classification Search
CPC ............... H10K 59/122; H10K 59/353; H10K 59/80522

See application file for complete search history.

(56) References Cited

U.S. PATENT DOCUMENTS

2021/0132720 A1*  5/2021  Lee .................. G06F 3/0446

FOREIGN PATENT DOCUMENTS

| JP | 5486920 B2 | 5/2014 |
|---|---|---|
| KR | 1020170013553 A | 2/2017 |
| KR | 1020170104085 A | 9/2017 |
| KR | 101975309 B1 | 9/2019 |
| KR | 1020200027600 A | 3/2020 |

* cited by examiner

*Primary Examiner* — Daniel P Shook
(74) *Attorney, Agent, or Firm* — CANTOR COLBURN LLP

(57) ABSTRACT

A display device includes: a substrate including a pixel area and a non-pixel area surrounding the pixel area, first, second and third light emitting elements on the substrate, and a pixel defining layer on the substrate. The pixel area includes first, second and third sub-pixel areas. The first light emitting element includes a first pixel electrode disposed in the first sub-pixel area. The second light emitting element includes a second pixel electrode disposed in the second sub-pixel area. The third light emitting element includes a third pixel electrode disposed in the third sub-pixel area. A peripheral opening overlapping the non-pixel area is defined in the pixel defining layer to continuously extend along between the first, second, and third sub-pixel areas. The pixel defining layer covers edges of each of the first, second, and third pixel electrodes on the substrate and continuously extends along at least two adjacent sub-pixel areas.

20 Claims, 17 Drawing Sheets

DISPLAY DEVICE

This application claims priority Korean Patent Application No. 10-2022-0081239, filed on Jul. 1, 2022, and all the benefits accruing therefrom under 35 U.S.C. § 119, the content of which in its entirety is herein incorporated by reference.

BACKGROUND

1. Field

Embodiments provide generally to a display device. More particularly, embodiments relate to a display device for providing visual information.

2. Description of the Related Art

With the development of information technology, the importance of a display device, which is a connection medium between a user and information, has been highlighted. For example, a display device such as a liquid crystal display device ("LCD"), an organic light emitting display device ("OLED"), a plasma display device ("PDP"), a quantum dot display device, and the like are widely used in various fields.

SUMMARY

Embodiments provide a display device having improved defects

A display device according to embodiments of the disclosure includes a substrate including a pixel area, a contact area adjacent to the pixel area, and a non-pixel area surrounding the pixel area and the contact area, a first light emitting element on the substrate, a second light emitting element on the substrate, a third light emitting element on the substrate, and a pixel defining layer on the substrate. In such embodiments, the pixel area includes a first sub-pixel area, a second sub-pixel area, and a third sub-pixel area. In such embodiments, the first light emitting element includes a first pixel electrode disposed in the first sub-pixel area. In such embodiments, the second light emitting element includes a second pixel electrode disposed in the second sub-pixel area. In such embodiments, the third light emitting element includes a third pixel electrode disposed in the third sub-pixel area. In such embodiments, a peripheral opening overlapping the non-pixel area is defined in the pixel defining layer to continuously extend along between the first, second, and third sub-pixel areas. In such embodiments, the pixel defining layer covers edges of each of the first, second, and third pixel electrodes on the substrate and continuously extends along at least two adjacent sub-pixel areas among the first, second, and third sub-pixel areas.

In an embodiment, the pixel area may be provided in plural and repeatedly arranged in a first direction and a second direction intersecting the first direction.

In an embodiment, the pixel defining layer may include: a first pattern portion covering an edge of the first pixel electrode, a second pattern portion covering an edge of the second pixel electrode, a third pattern portion covering an edge of the third pixel electrode, a first connection portion covering a portion of the first pixel electrode and connected between the first, second, and third pattern portions positioned in one pixel area, and a second connection portion connected between the first pattern portion positioned in a first pixel are and the third pattern portion in a second pixel area adjacent to the first pixel area, and connected between the third pattern portion positioned in the second pixel area and the second pattern portion positioned in the second pixel area.

In an embodiment, a width of the second connection portion may be smaller than a width of each of the first, second, and third pattern portions.

In an embodiment, an opening exposing a portion of an upper surface of each of the first, second, and third pixel electrodes may be further defined in the pixel defining layer.

In an embodiment, the pixel defining layer may include an inorganic material or an organic material.

In an embodiment, the display device may further include a first transistor disposed in the first sub-pixel area on the substrate and including a first drain electrode connected to the first pixel electrode, a second transistor disposed in the second sub-pixel area on the substrate and including a second drain electrode connected to the second pixel electrode, and a third transistor disposed in the third sub-pixel area on the substrate and including a third drain electrode connected to the third pixel electrode.

In an embodiment, the substrate further may include a contact area adjacent to the pixel area.

In an embodiment, the display device may further include a conductive pattern disposed in the contact area on the substrate and including a same material as the first, second, and third drain electrodes and an auxiliary electrode connected to the conductive pattern and including a same material as the first, second, and third pixel electrodes.

In an embodiment, the display device may further include an insulating pattern disposed in the contact area on the conductive pattern, in which an opening exposing a portion of an upper surface of the auxiliary electrode is defined, where the insulating pattern includes a same material as the pixel defining layer.

In an embodiment, the peripheral opening overlapping the non-pixel area may be further defined in the insulating pattern. In such an embodiment, the peripheral opening continuously may extend between the first, second, and third sub-pixel areas and the contact area.

In an embodiment, the insulating pattern may be spaced apart from the pixel defining layer.

In an embodiment, the insulating pattern may have an island shape in a plan view.

In an embodiment, the insulating pattern may cover an edge of the auxiliary electrode.

In an embodiment, the display device may further include a planarization layer covering the first, second, and third drain electrodes under the first, second, and third pixel electrodes, and covering the conductive pattern under the auxiliary electrode. In such an embodiment, the peripheral opening may expose an upper surface of the planarization layer.

In an embodiment, the display device may further include a common layer disposed on the planarization layer and covering the pixel defining layer and the insulating pattern. In such an embodiment, the each of the first, second, and third light emitting element may further include a common electrode disposed entirely on the common layer and connected to the auxiliary electrode through a contact hole defined in the common layer in the contact area.

A display device according to embodiments of the disclosure includes a substrate including a pixel area and a non-pixel area surrounding the pixel area, a planarization layer disposed on the substrate, a first light emitting element on the planarization layer, a second light emitting element on the planarization layer, a third light emitting element on the planarization layer, and a pixel defining layer on the substrate. In such embodiments, the pixel area includes a first sub-pixel area, a second sub-pixel area, and a third sub-pixel area emitting light of different colors. In such embodiments, the first light emitting element includes a first pixel electrode disposed in the first sub-pixel area. In such embodiments, the second light emitting element includes a second pixel electrode disposed in the second sub-pixel area. In such embodiments, the third light emitting element includes a third pixel electrode disposed in the third sub-pixel area. In such embodiments, a peripheral opening exposing an upper surface of the planarization layer in the non-pixel area is defined in the pixel defining layer to continuously extend along at least two adjacent sub-pixel areas among the first, second, and third sub-pixel areas on the planarization layer.

In an embodiment, the pixel area may be provided in plural and repeatedly arranged in a first direction and a second direction intersecting the first direction.

In an embodiment, the pixel defining layer may include: a first pattern portion covering an edge of the first pixel electrode, a second pattern portion covering an edge of the second pixel electrode, a third pattern portion covering an edge of the third pixel electrode, a first connection portion covering a portion of the first pixel electrode and connected between the first, second, and third pattern portions positioned in one pixel area, and a second connection portion connected between the first pattern portion positioned in a first pixel area and the third pattern portion in a second pixel area adjacent to the first pixel area, and connected between the third pattern portion positioned in the second pixel area and the second pattern portion positioned in the second pixel area.

In an embodiment, the contact area may be an area on which one of a laser drilling process, an organic film taper adjustment process, and an organic film reverse taper adjustment process is performed.

In a display device according to embodiments of the invention, a pixel defining layer may cover an edge of each of first, second, and third pixel electrodes, and may continuously extend along at least two sub-pixel areas among first, second, and third sub-pixel areas. In such embodiments, a peripheral opening overlapping a non-pixel area surrounding the first, second, and third sub-pixel areas may be defined in the pixel defining layer and the peripheral opening may continuously extend between the first, second, and third sub-pixel areas. In such embodiments, a thickness of an encapsulation layer overlapping the peripheral opening may be relatively thick such that defects of the display device due to penetration of impurities, moisture, external air, and the like may be effectively prevented.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
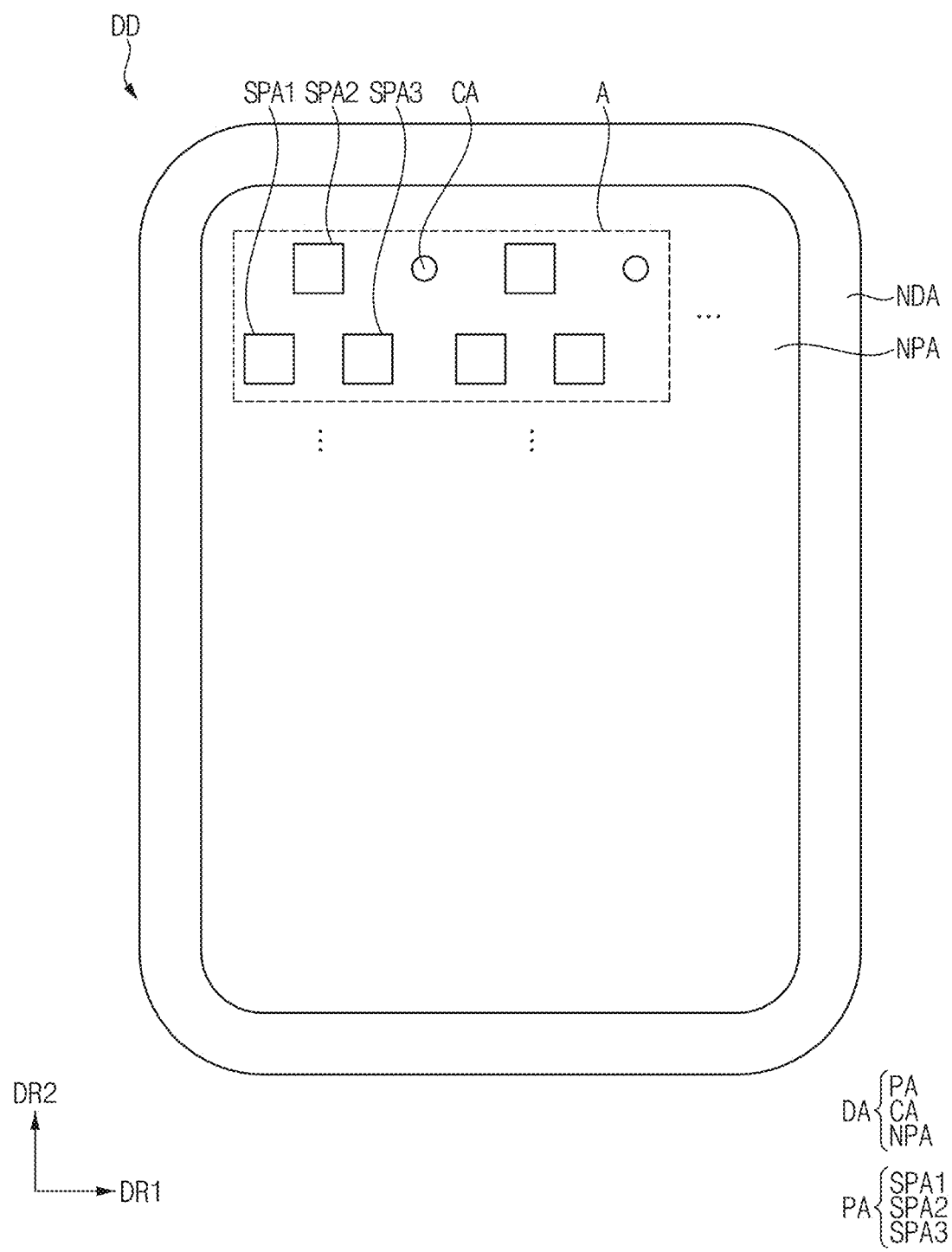
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display device according to embodiments of the disclosure will be described in detail with reference to the accompanying drawings. The same reference numerals are used for the same components in the drawings, and any repetitive detailed descriptions of the same components may be omitted.

FIG. 1 is a plan view illustrating a display device according to an embodiment.

Referring to FIG. 1, a display device DD according to an embodiment may include a display area DA and a non-display area NDA. The display area DA may be an area capable of displaying an image by generating light or adjusting transmittance of light provided from an external light source. The non-display area NDA may be an area that does not display an image. The non-display area NDA may be positioned around the display area DA. In an embodiment, for example, the non-display area NDA may surround the display area DA.

The display area DA may include a plurality of pixel areas PA, a plurality of contact areas CA, and a non-pixel area NPA.

Each of the plurality of pixel areas PA may include a first sub-pixel area SPA1, a second sub-pixel area SPA2, and a third sub-pixel area SPA3.

Each of the first sub-pixel area SPA1, the second sub-pixel area SPA2, and the third sub-pixel area SPA3 may be an area in which light emitted from a light emitting element is emitted to an outside of the display device DD.

The first sub-pixel area SPA1, the second sub-pixel area SPA2, and the third sub-pixel area SPA3 may emit light of different colors from each other. In an embodiment, for example, the first sub-pixel area SPA1 may emit first light, the second sub-pixel area SPA2 may emit second light, and the third sub-pixel area SPA3 may emit third light. In an embodiment, the first light may be red light, the second light may be green light, and the third light may be blue light. However, the configuration of the invention is not limited thereto. In an alternative embodiment, for example, the first sub-pixel area SPA1, the second sub-pixel area SPA2, and the third sub-pixel area SPA3 may emit yellow, cyan and magenta lights.

The first sub-pixel area SPA1, the second sub-pixel area SPA2, and the third sub-pixel area SPA3 may emit light of four or more colors. In an embodiment, for example, the first sub-pixel area SPA1, the second sub-pixel area SPA2, and the third sub-pixel area SPA3 may be combined to further emit at least one of yellow, cyan, and magenta lights in addition to red, green, and blue lights. In addition, the first sub-pixel area SPA1, the second sub-pixel area SPA2, and the third sub-pixel area SPA3 may be combined to further emit white light.

Each of the first sub-pixel area SPA1, the second sub-pixel area SPA2, and the third sub-pixel area SPA3 may have a triangular planar shape, a rectangular planar shape, a circular planar shape, a track-type planar shape, elliptical planar shape or the like. In an embodiment, as shown in FIG. 1, each of the first sub-pixel area SPA1, the second sub-pixel area SPA2, and the third sub-pixel area SPA3 may have a rectangular planar shape. However, the configuration of the invention is not limited thereto.

In a plan view, the pixel areas PA may be repeatedly arranged along a row direction and a column direction. In an embodiment, the pixel areas PA may be repeatedly arranged along a first direction DR1 and a second direction DR2 intersecting the first direction DR1. In an embodiment, for example, the second sub-pixel areas SPA2 may be repeatedly arranged in an odd-numbered row (e.g., a first row) in the first direction DR1. In such an embodiment, the first sub-pixel areas SPA1 and the third sub-pixel areas SPA3 may be alternately arranged along the first direction DR1 in an even-numbered row (e.g., a second row) adjacent to the odd-numbered row.

In a plan view, the contact areas CA may be repeatedly arranged between the pixel areas PA along the first direction DR1 and the second direction DR2. In an embodiment, for example, the contact areas CA may be repeatedly arranged in the odd-numbered row along the first direction DR1. That is, each of the contact areas CA may be positioned between the second sub-pixel areas SPA2. Each of the contact areas CA may be an area in which a laser drilling process is performed so that an auxiliary electrode (e.g., an auxiliary electrode AE of FIG. 4) and a common electrode (e.g., a common electrode CE of FIGS. 3 and 4) are connected to lower a resistance of the common electrode. However, the invention is not limited thereto. In an alternative embodiment, for example, each of the contact areas CA may be an area in which an organic taper adjustment process or an organic reverse taper adjustment process in which a portion is removed to form an organic film (e.g., a common layer CL of FIG. 3) having a tapered shape (or a reverse tapered shape), and the auxiliary electrode and the common electrode are connected through the organic film is performed.

The non-pixel area NPA may be positioned between the pixel areas PA and the contact areas CA. In an embodiment, for example, the non-pixel area NPA may surround the pixel areas PA and the contact areas CA. The non-pixel area NPA may be an area remaining in the display area DA except for the pixel areas PA and the contact areas CA. That is, the light emitting element emitting light may not be disposed in the non-pixel area NPA. Accordingly, the non-pixel area NPA may not emit light.

Figure 2:
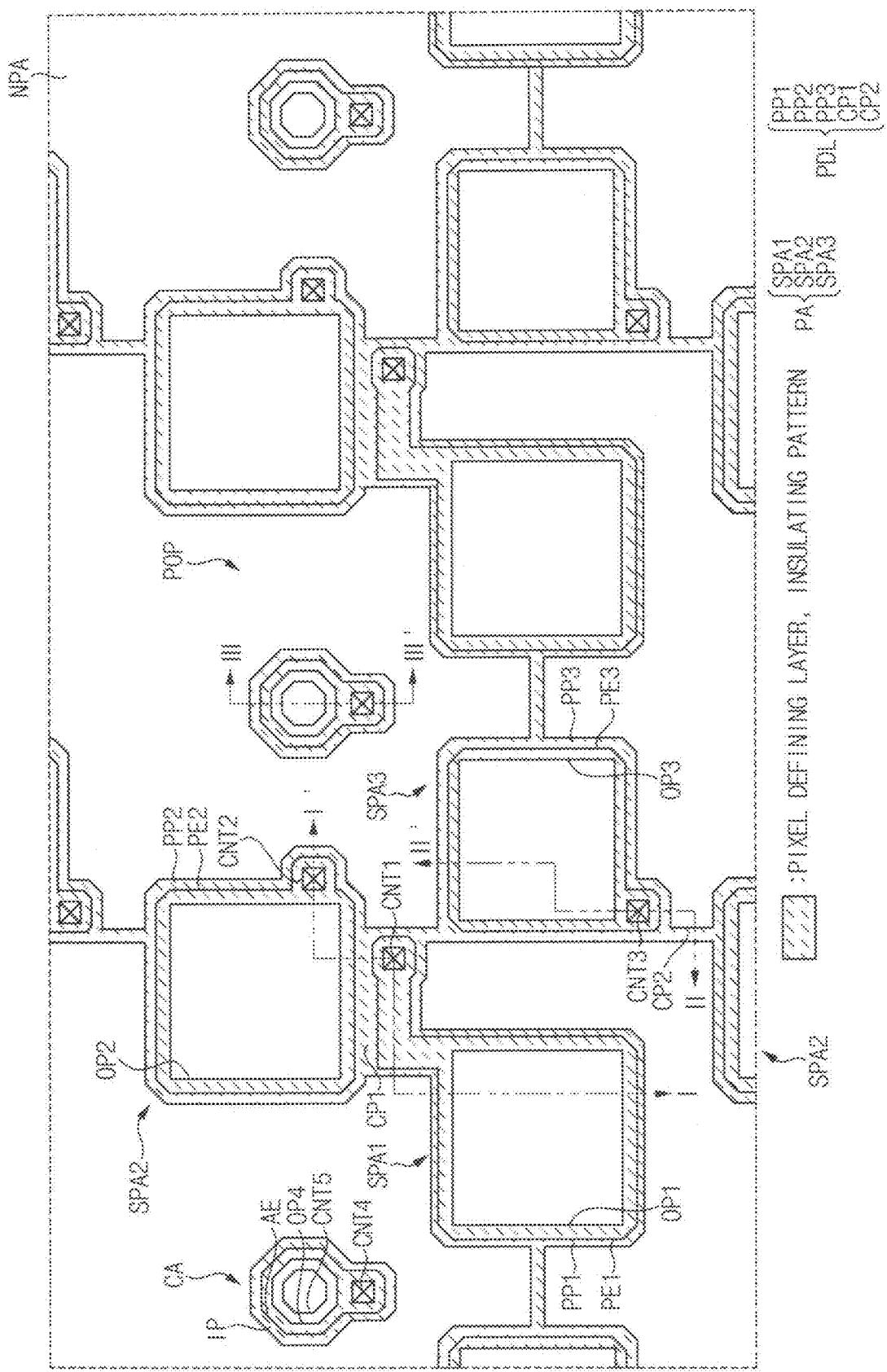
FIG. 2 is an enlarged plan view illustrating the encircled portion "A" of FIG. 1.

FIG. 2 is an enlarged plan view illustrating the encircled portion "A" of FIG. 1.

Referring to FIGS. 1 and 2, as described above, the display device DD according to an embodiment may include the display area DA and the non-display area NDA, the display area DA may include the pixel areas PA, the contact areas CA, and the non-pixel area NPA, and each of the pixel areas PA may include the first sub-pixel area SPA1, the second sub-pixel area SPA2 and the third sub-pixel area SPA3.

The display device DD may include a first light emitting element (e.g., a first light emitting element 200a of FIG. 3) including a first pixel electrode PE1, a second light emitting element (e.g., the second light emitting element 200b of FIG. 3) including a second pixel electrode PE2, a third light emitting element (e.g., the third light emitting element 200c of FIG. 3) including the third pixel electrode PE3, and an auxiliary electrode AE, a pixel defining layer PDL, and an insulating pattern IP.

The pixel defining layer PDL may cover an edge of each of the first, second, and third pixel electrodes PE1, PE2, and PE3. In addition, a first opening OP1 overlapping the first sub-pixel area SPA1, a second opening OP2 overlapping the second sub-pixel area SPA2, and a third opening OP3 overlapping the third sub-pixel area SPA3 may be defined in the pixel defining layer PDL.

The pixel defining layer PDL may continuously extend along the first, second, and third sub-pixel areas SPA1, SPA2, and SPA3. However, the invention is not limited thereto, and the pixel defining layer PDL may continuously extend along at least two sub-pixel areas among the first, second, and third sub-pixel areas SPA1, SPA2 and SPA3. In an embodiment, for example, the pixel defining layer PDL may continuously extend along the first and second sub-pixel areas SPA1 and SPA2. In such an embodiment, the pixel defining layer PDL may be independently disposed in the third sub-pixel area SP3.

The insulating pattern IP may cover an edge of the auxiliary electrode AE. In an embodiment, the insulating pattern IP may be disposed only on the edge of the auxiliary electrode AE. In an embodiment, for example, the insulating pattern IP may have an island shape in a plan view. In such an embodiment, a fourth opening OP4 overlapping the contact area CA may be defined in the insulating pattern IP.

In an embodiment, the insulating pattern IP may be disposed to be spaced apart from the pixel defining layer PDL. That is, the insulating pattern IP may be disposed independently of the pixel defining layer PDL. In such an embodiment, the insulating pattern IP may not be connected to the pixel defining layer PDL.

In an embodiment, a peripheral opening POP overlapping in non-pixel area NPA may be defined in the pixel defining layer PDL. The peripheral opening POP may continuously extend between the first, second, and third pixel areas SPA1, SPA2, and SPA3. In addition, the peripheral opening POP continuously extending between the contact areas CA to overlap the non-pixel area NPA may be defined in the insulating pattern IP. That is, the pixel defining layer PDL and the insulating pattern IP may share the peripheral opening POP. in an embodiment, the pixel defining layer PDL and the insulating pattern IP may be separated from each other by the peripheral opening POP.

In an embodiment, the pixel defining layer PDL may be disposed only on an edge of the first, second, and third pixel electrodes PE1, PE2, and PE3. In an embodiment, for example, the pixel defining layer PDL may include a first pattern portion PP1, a second pattern portion PP2, a third pattern portion PP3, a first connection portion CP1, and a second connection portion CP2.

In an embodiment, the first pattern portion PP1 may cover the edge of the first pixel electrode PE1, the second pattern portion PP2 may cover the edge of the second pixel electrode PE2, and the third pattern portion PP3 may cover the edge of the third pixel electrode PE3.

The first connection portion CP1 may include a portion of the first pixel electrode PE1 in which a first contact hole CNT1 connected to a first drain electrode (e.g., a first drain electrode DE1 of FIG. 4) is positioned. In detail, the first connection portion CP1 may overlap a portion protruding from the first pixel electrode PE1. In an embodiment, the first connection part CP1 may connect the first, second, and third pattern portions PP1, PP2, and PP3 positioned in one pixel area PA.

In an embodiment, the second connection portion CP2 may connect the first pattern portion PP1 positioned in a first pixel area among the pixel areas PA and the second pattern portion PP2 positioned in a second pixel area adjacent to first pixel area among the pixel areas PA, and may connect the third pattern portion PP3 positioned in the second pixel area and the second pattern portion PP3 positioned in a third pixel area among the pixel areas PA.

In an embodiment, for example, the second pixel area may be adjacent to the first pixel area in the first direction DR1. In such an embodiment, the third pixel area may be adjacent to the second pixel area in the second direction DR2. The second direction DR2 may be perpendicular to the first direction DR1.

In an embodiment, the second connection portion CP2 may overlap the non-pixel area NPA without overlapping the first, second, and third sub-pixel areas SPA1, SPA2, and SPA3. That is, the first, second, and third pixel electrodes PE1, PE2, and PE3 may not be disposed under the second connection part CP2.

A width of the second connection portion CP2 may be different from a width of each of the first, second, and third pattern portions PP1, PP2, and PP3. In an embodiment, the width of the second connection portion CP2 may be smaller than the width of each of the first, second, and third pattern portions PP1, PP2, and PP3.

Hereinafter, components included in the display device DD according to an embodiment will be described in greater detail according to a stacked structure.

Figure 3:
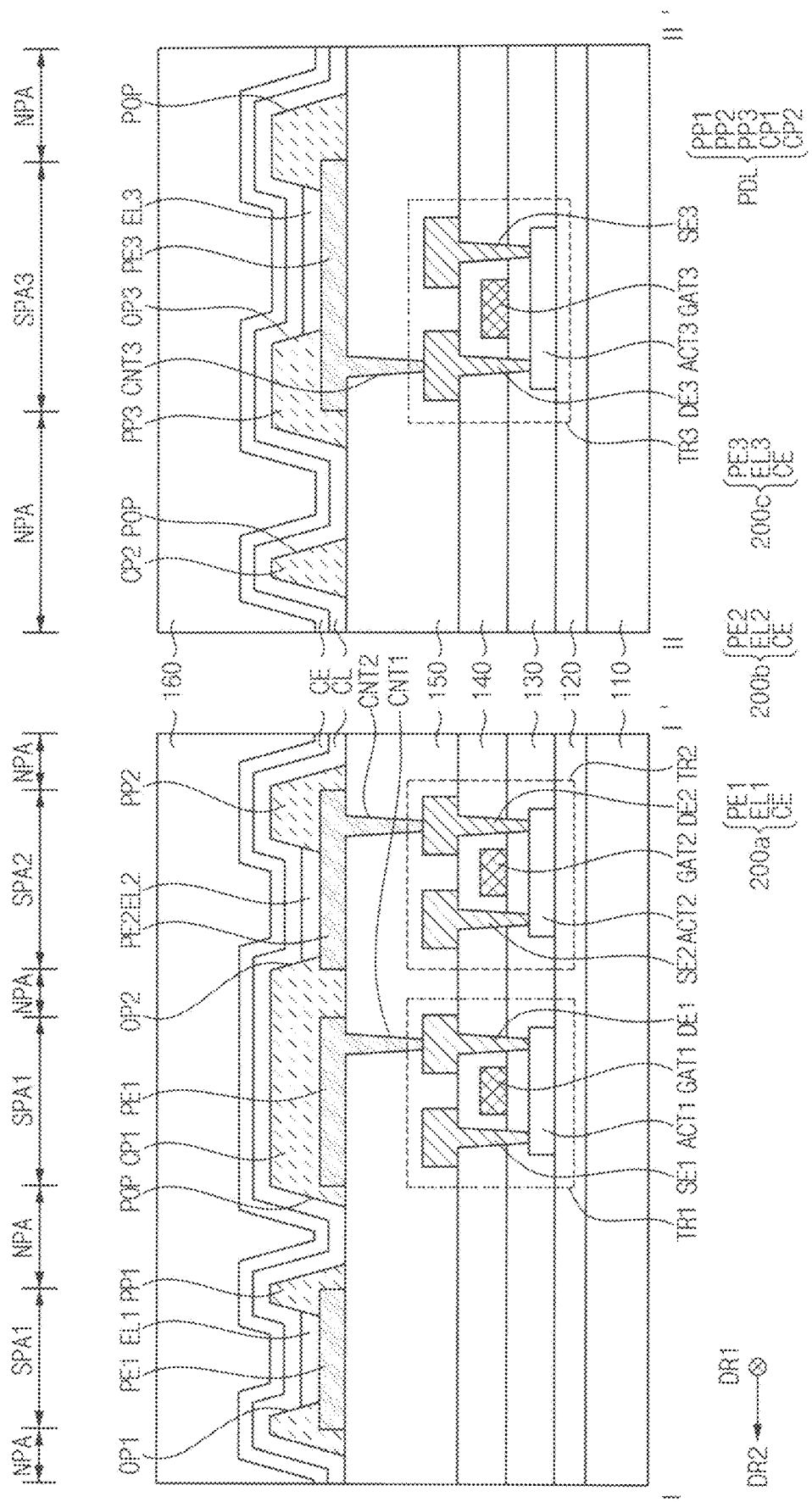
FIG. 3 is a cross-sectional view taken along lines I-I' and II-II' of FIG. 2.
Figure 4:
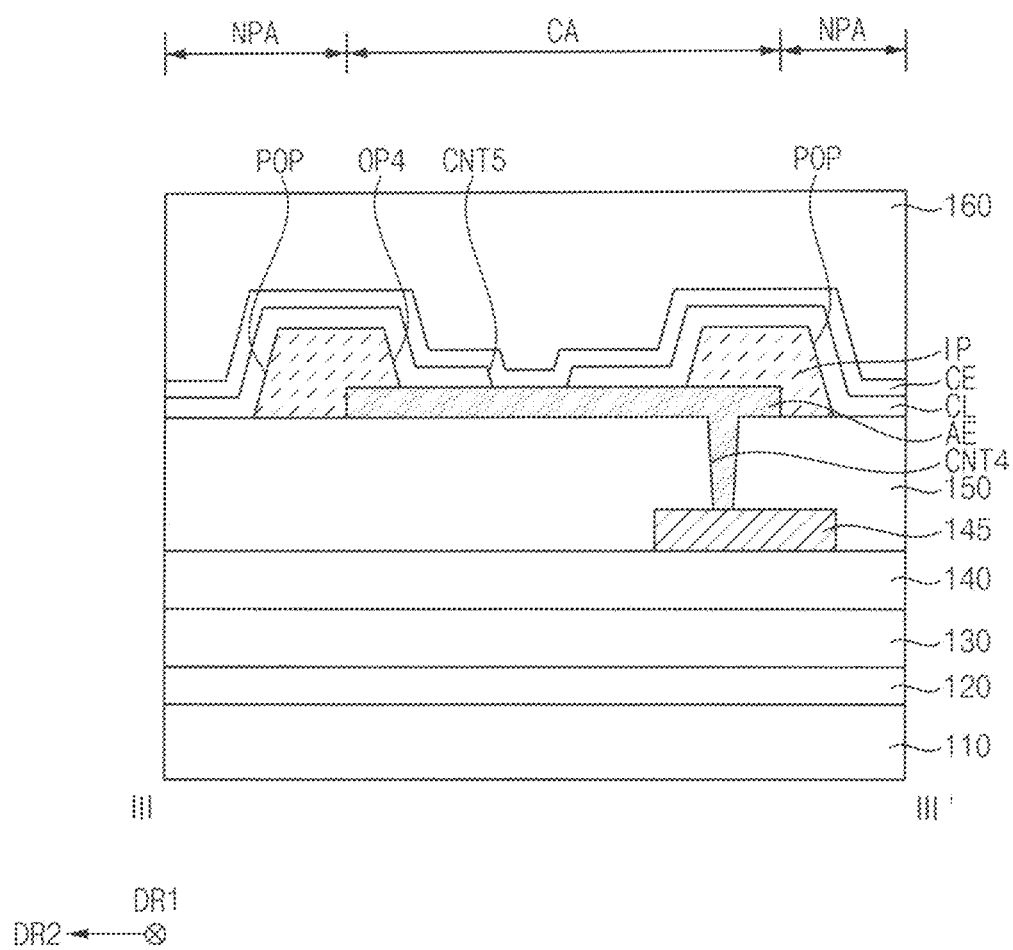
FIG. 4 is a cross-sectional view taken along line III-III' of FIG. 2.

FIG. 3 is a cross-sectional view taken along lines I-I' and II-II' of FIG. 2. FIG. 4 is a cross-sectional view taken along line III-III' of FIG. 2.

FIGS. 1, 2, 3 and 4, the display device DD according to an embodiment may include a substrate 110, a buffer layer 120, a gate insulating layer 130, first, second, and third transistors TR1, TR2, and TR3, an interlayer insulating layer 140, a conductive pattern 145, a planarization layer 150, the pixel defining layer PDL, the insulating pattern IP, the first, second, and third light emitting elements 200a, 200b, and 200c, the auxiliary electrode AE, the common layer CL and an encapsulation layer 160.

In such an embodiment, the first transistor TR1 may include a first active layer ACT1, a first gate electrode GAT1, a first source electrode SE1, and a first drain electrode DE1. The second transistor TR2 may include a second active layer ACT2, a second gate electrode GAT2, a second source electrode SE2, and a second drain electrode DE2. The third transistor TR3 may include a third active layer ACT3, a third gate electrode GAT3, a third source electrode SE3, and a third drain electrode DE3.

In such an embodiment, the first light emitting element 200a may include the first pixel electrode PE1, a first light emitting layer EL1, and the common electrode CE. The second light emitting element 200*b* may include the second pixel electrode PE2, a second light emitting layer EL2, and the common electrode CE. The third light emitting element 200*c* may include the third pixel electrode PE3, a third light emitting layer EL3, and the common electrode CE.

In an embodiment, as described above, the display device DD may include the display area DA including the pixel areas PA and the non-pixel area NPA, and the non-display area NDA. In such an embodiment where the display device DD includes the display area DA and the non-display area NDA, components (e.g., the substrate 110) included in the display device DD also include the display area DA and a non-display area NDA.

The substrate 110 may include a transparent material or an opaque material. The substrate 110 may include or be formed of a transparent resin substrate. In an embodiment, for example, the transparent resin substrate may include a polyimide substrate or the like. In such an embodiment, the polyimide substrate may include a first organic layer, a first barrier layer, a second organic layer, or the like. Alternatively, the substrate 110 may include a quartz substrate, a synthetic quartz substrate, a calcium fluoride substrate, a fluorine-doped quartz substrate, a soda-lime substrate, a non-alkali glass substrate, or the like. These may be used alone or in combination with each other.

The buffer layer 120 may be disposed on the substrate 110. The buffer layer 120 may prevent diffusion of metal atoms or impurities from the substrate 110 to the first, second, and third transistors TR1, TR2, and TR3. In an embodiment, where the surface of the substrate 110 is not uniform, the buffer layer 120 may improve the flatness of the surface of the substrate 110. In an embodiment, for example, the buffer layer 120 may include an inorganic material such as silicon oxide, silicon nitride, silicon oxynitride, or the like. These may be used alone or in combination.

The first, second, and third active layers ACT1, ACT2, and ACT3 may be disposed on the buffer layer 120. Each of the first, second, and third active layers ACT1, ACT2, and ACT3 may include a metal oxide semiconductor, an inorganic semiconductor (e.g., amorphous silicon, polysilicon), or an organic semiconductor. The first, second, and third active layers ACT1, ACT2, and ACT3 may include a same material as each other. In an embodiment, for example, each of the first, second, and third active layers ACT1, ACT2, and ACT3 may include a source region, a drain region, and a channel region positioned between the source region and the drain region.

The metal oxide semiconductor may include a binary compound ($AB_x$), a ternary compound ($AB_xC_y$), a quaternary compound ($AB_xC_yD_z$), or the like containing indium (In), zinc (Zn), gallium (Ga), tin (Sn), titanium (Ti), aluminum (Al), hafnium (Hf), zirconium (Zr), magnesium (Mg), and the like. In an embodiment, for example, the metal oxide semiconductor may include zinc oxide ($ZnO_x$), gallium oxide ($GaO_x$), tin oxide ($SnO_x$), indium oxide ($InO_x$), indium gallium oxide ("IGO"), indium zinc oxide ("IZO"), and indium tin oxide. ("ITO"), indium zinc tin oxide ("IZTO"), indium gallium zinc oxide ("IGZO"), or the like. These may be used alone or in combination with each other.

The gate insulating layer 130 may be disposed on the buffer layer 120. The gate insulating layer 130 may sufficiently cover the first, second, and third active layers ACT1, ACT2, and ACT3, and may have a substantially flat upper surface without creating a step around the first, second, and third active layers ACT1, ACT2, and ACT3. Alternatively, the gate insulating layer 130 may cover the first, second, and third active layers ACT1, ACT2, and ACT3, and may be disposed along a profile of each of the first, second, and third active layers ACT1, ACT2 and ACT3 with a uniform thickness. In an embodiment, for example, the gate insulating layer 130 may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The first, second, and third gate electrodes GAT1, GAT2, and GAT3 may be disposed on the gate insulating layer 130. The first gate electrode GAT1 may overlap the channel region of the first active layer ACT1, the second gate electrode GAT2 may overlap the channel region of the second active layer ACT2, and the third gate electrode GAT3 may overlap the channel region of the third active layer ACT3. In an embodiment, for example, each of the first, second, and third gate electrodes GAT1, GAT2, and GAT3 may include a metal, an alloy, a metal nitride, a conductive metal oxide, a transparent conductive material, or the like. These may be used alone or in combination with each other. The first, second, and third gate electrodes GAT1, GAT2, and GAT3 may include a same material as each other.

The interlayer insulating layer 140 may be disposed on the gate insulating layer 130. The interlayer insulating layer 140 may sufficiently cover the first, second, and third gate electrodes GAT1, GAT2, and GAT3, and may have a substantially flat upper surface without creating a step around the first, second, and third gate electrodes GAT1, GAT2, and GAT3. Alternatively, the interlayer insulating layer 140 may cover the first, second, and third gate electrodes GAT1, GAT2, and GAT3, and may be disposed along a profile of each of the first, second, and third gate electrodes GAT1, GAT2, and GAT3 with a uniform thickness. In an embodiment, for example, the insulating interlayer 140 may include an inorganic material such as silicon oxide, silicon nitride, silicon carbide, silicon oxynitride, silicon oxycarbide, or the like. These may be used alone or in combination with each other.

The first, second, and third source electrodes SE1, SE2, and SE3 may be disposed on the interlayer insulating layer 140. The first source electrode SE1 may be connected to the source region of the first active layer ACT1 through a contact hole defined in the gate insulating layer 130 and the interlayer insulating layer 140. The second source electrode SE2 may be connected to the source region of the second active layer ACT2 through a contact hole defined in the gate insulating layer 130 and the interlayer insulating layer 140. The third source electrode SE3 may be connected to the source region of the third active layer ACT3 through a contact hole defined in the gate insulating layer 130 and the interlayer insulating layer 140.

The first, second, and third drain electrodes DE1, DE2, and DE3 may be disposed on the interlayer insulating layer 140. The first drain electrode DE1 may be connected to the drain region of the first active layer ACT1 through a contact hole defined in the gate insulating layer 130 and the interlayer insulating layer 140. The second drain electrode DE2 may be connected to the drain region of the second active layer ACT2 through a contact hole defined in the gate insulating layer 130 and the interlayer insulating layer 140. The third drain electrode DE3 may be connected to the drain region of the third active layer ACT3 through a contact hole defined in the gate insulating layer 130 and the interlayer insulating layer 140.

In an embodiment, for example, each of the first, second, and third source electrodes SE1, SE2, and SE3 may include a metal, an alloy, a metal nitride, a conductive metal oxide, a transparent conductive material, or the like. These may be used alone or in combination with each other. The first, second, and third drain electrodes DE1, DE2, and DE3 may include a same material as the first, second, and third source electrodes SE1, SE2, and SE3.

Accordingly, the first transistor TR1 including the first active layer ACT1, the first gate electrode GAT1, the first source electrode SE1, and the first drain electrode DE1 may be disposed in the first sub-pixel area SPA1 on the substrate 110, the second transistor TR2 including the second active layer ACT2, the second gate electrode GAT2, the second source electrode SE2 and the second drain electrode DE2 may be disposed in the second sub-pixel area SPA2 on the substrate 110, and the third transistor TR including the third active layer ACT3, the third gate electrode GAT3, the third source electrode SE3, and the third drain electrode DE3 may be disposed in the third sub-pixel area SPA3 on the substrate 110.

The conductive pattern 145 may be disposed in the contact area CA on the interlayer insulating layer 140. In an embodiment, for example, the conductive pattern 145 may include a metal, an alloy, a metal nitride, a conductive metal oxide, a transparent conductive material, or the like. These may be used alone or in combination with each other.

In an embodiment, the conductive pattern 145 may include or be formed of a same material as the first, second, and third source electrodes SE1, SE2, and SE3 (or the first, second, and third drain electrodes DE1, DE2, and DE3). That is, the conductive pattern 145 may be disposed in (or directly on) a same layer as the first, second, and third source electrodes SE1, SE2, and SE3 (or the first, second, and third drain electrodes DE1, DE2, and DE3).

The planarization layer 150 may be disposed on the interlayer insulating layer 140. The planarization layer 150 may sufficiently cover the first, second, and third source electrodes SE1, SE2, and SE3, the first, second, and third drain electrodes DE1, DE2, and DE3, and the conductive pattern 145. The planarization layer 150 may include an organic material. In an embodiment, for example, the planarization layer 150 may include an organic material such as a phenolic resin, a polyacrylates resin, a polyimides rein, a polyamides resin, a siloxane resin, an epoxy resin, or the like. These may be used alone or in combination with each other.

The pixel electrodes PE1, PE2, and PE3 may be disposed in the sub-pixel areas SPA1, SPA2, and SPA3 on the planarization layer 150. In an embodiment, the first pixel electrode PE1 may be disposed in the first sub-pixel area SPA1, the second pixel electrode PE2 may be disposed in the second sub-pixel area SPA2, and the third pixel electrode PE3 may be disposed in the third sub-pixel area SPA3. The first pixel electrode PE1 may be connected to the first drain electrode DE1 through a first contact hole CNT1 defined in the planarization layer 150, the second pixel electrode PE2 may be connected to the second drain electrode DE2 through a second contact hole CNT2 defined in the planarization layer 150, and the third pixel electrode PE3 may be connected to the third drain electrode DE3 through a third contact hole CNT3 defined in the planarization layer 150.

In an embodiment, for example, each of the first, second, and third pixel electrodes PE1, PE2, and PE3 may include a metal, an alloy, a metal nitride, a conductive metal oxide, a transparent conductive material, or the like. These may be used alone or in combination with each other. In an embodiment, each of the first, second, and third pixel electrodes PE1, PE2, and PE3 may have a stacked structure including ITO/Ag/ITO. The first, second, and third pixel electrodes PE1, PE2, and PE3 may include a same material as each other. In an embodiment, for example, each of the first, second, and third pixel electrodes PE1, PE2, and PE3 may operate as an anode.

In an embodiment, as shown in FIG. 4, the auxiliary electrode AE may be disposed in the contact area CA on the planarization layer 150. The auxiliary electrode AE may be connected to the conductive pattern 145 through the fourth contact hole CNT4 defined in the planarization layer 150. In an embodiment, for example, the auxiliary electrode AE may include a metal, an alloy, a metal nitride, a conductive metal oxide, a transparent conductive material, or the like. These may be used alone or in combination with each other.

In an embodiment, the auxiliary electrode AE may include a same material as the first, second, and third pixel electrodes PE1, PE2, and PE3. In such an embodiment, the auxiliary electrode AE may be disposed in (or directly on) a same layer as the first, second, and third pixel electrodes PE1, PE2, and PE3.

The pixel defining layer PDL may be disposed on the planarization layer 150. The pixel defining layer PDL may partially overlap the first, second, and third sub-pixel areas SPA1, SPA2, and SPA3. The pixel defining layer PDL may cover an edge of each of the first, second, and third pixel electrodes PE1, PE2, and PE3. In addition, the first opening OP1 exposing a portion of an upper surface of the first pixel electrode PE1, the second opening OP2 exposing a portion of an upper surface of the second pixel electrode PE2, and the third opening OP3 exposing a portion of an upper surface of the third pixel electrode PE3 may be defined in the pixel defining layer PDL.

In an embodiment, as described above, the pixel defining layer PDL may include the first pattern portion PP1 covering the edge of the first pixel electrode PE1, the second pattern portion PP2 covering the edge of the second pixel electrode PE2, the third pattern portion PP3 covering the edge of the third pixel electrode PE3, the first connection portion CP1 overlapping a portion of the first pixel electrode PE1, and the second connection portion CP2 overlapping the non-pixel area NPA. In an embodiment, the first connection portion CP1 may cover a portion of the first pixel electrode PE1 in which the first contact hole CNT1 connected to the first drain electrode DE1 is positioned.

The pixel defining layer PDL may include an inorganic material or an organic material. In an embodiment, the pixel defining layer PDL may include an organic material. In an embodiment, for example, the pixel defining layer PDL may include an organic material such as polyimide ("PI").

The pixel defining layer PDL may further include a light blocking material with black color. In an embodiment, for example, the pixel defining layer PDL may further include a light blocking material such as a black pigment, a black dye, carbon black, or the like. These may be used alone or in combination with each other.

The insulating pattern IP may be disposed on the planarization layer 150. The insulating pattern IP may partially overlap the contact area CA. The insulating pattern IP may cover an edge of the auxiliary electrode AE. In addition, the fourth opening OP4 exposing a portion of an upper surface of the auxiliary electrode AE may be defined in the insulating pattern IP.

In an embodiment, the insulating pattern IP may include a same material as the pixel defining layer PDL. In such an embodiment, the insulating pattern IP may be disposed in (or directly on) a same layer as the pixel defining layer PDL.

In an embodiment, the peripheral opening POP exposing the upper surface of the planarization layer 150 in the non-pixel area NPA may be defined in each of the pixel defining layer PDL and the insulating pattern IP. In such an embodiment, the peripheral opening POP may be defined or formed between the pixel defining layer PDL and the insulating pattern IP.

The first, second, and third light emitting layers EL1, EL2, and EL3 may be disposed on the first, second, and third pixel electrodes PE1, PE2, and PE3, respectively. In an embodiment, the first, second, and third emission layers EL1, EL2, and EL3 may be disposed in the first, second, and third openings OP1, OP2, and OP3 of the first, second, and third pixel electrodes PE1, PE2 and PE3, respectively. The each of the first, second, third light emitting layers EL1, EL2, and EL3 may be formed using at least one of light emitting materials capable of emitting red light, green light, and blue light. In an embodiment, for example, the first light emitting layer EL1 may emit red light, the second light emitting layer EL2 may emit green light, and the third light emitting layer EL3 may emit blue light. However, the configuration of the invention is not limited thereto, and the first, second, and third light emitting layers EL1, EL2, and EL3 may emit blue light. In an embodiment, for example, each of the first, second, and third light emitting layers EL1, EL2, and EL3 may include a low molecular weight organic compound or a high molecular weight organic compound.

The common layer CL may be disposed on the planarization layer 150, the auxiliary electrode AE1, the first light emitting layer EL1, the second light emitting layer EL2, and the third light emitting layer EL3. The common layer CL may be entirely disposed in the pixel area PA, the contact area CA, and the non-pixel area NPA. The common layer CL may include a hole injection layer, a hole transport layer, an electron transport layer, an electron injection layer, and the like. Although not shown in detail in FIG. 3, the first, second, and third light emitting layers EL1, EL2, and EL3 may be disposed between the hole transport layer and the electron transport layer.

The fifth contact hole CNT5 that exposes a portion of the upper surface of the auxiliary electrode AE in the contact area CA may be formed or defined through the common layer CL. In an embodiment, the fifth contact hole CNT5 may be formed by removing a portion of the common layer CL through a laser drilling process. In an alternative embodiment, the fifth contact hole CNT5 may be formed by removing a portion of the common layer CL through an organic layer taper adjustment process or an organic layer reverse taper adjustment process.

The common electrode CE may be disposed on the common layer CL. The common electrode CE may be entirely disposed in the pixel area PA, the contact area CA, and the non-pixel area NPA. The common electrode CE may include a metal, an alloy, a metal nitride, a conductive metal oxide, a transparent conductive material, or the like. These may be used alone or in combination with each other. In an embodiment, the common electrode CE may have a stacked structure including Mg and Ag. In an embodiment, for example, the common electrode CE may act as a cathode.

In an embodiment, the common electrode CE may be connected to the auxiliary electrode AE through the fifth contact hole CNT5 of the common layer CL in the contact area CA. That is, the common electrode CE may be electrically connected to the auxiliary electrode AE through the fifth contact hole CNT5 of the common layer CL in the contact area CA. Accordingly, the resistance of the common electrode CE may be reduced.

Accordingly, the first light emitting element 200a including the first pixel electrode PE1, the first light emitting layer EL1, and the common electrode CE may be disposed in the first sub-pixel area SPA1 on the substrate 110, the second light emitting element 200b including the second pixel electrode PE2, the second light emitting layer EL2 and the common electrode CE may be disposed in the second sub pixel area SPA2 on the substrate 110, and the third light emitting element 200c including the three pixel electrode PE3, the third light emitting layer EL3, and the common electrode CE may be disposed in the third sub-pixel area SPA3 on the substrate 110.

The encapsulation layer 160 may be disposed on the common electrode CE. The encapsulation layer 160 may prevent impurities, moisture, external air, and the like from penetrating into the first, second, and third light emitting elements 200a, 200b, and 200c from an outside. The encapsulation layer 160 may include at least one inorganic encapsulation layer and at least one organic encapsulation layer. In an embodiment, for example, the inorganic encapsulation layer may include silicon oxide, silicon nitride, silicon oxynitride, or the like. These may be used alone or in combination with each other. The organic encapsulation layer may include a cured polymer such as polyacrylate.

According to a comparative example, a thickness of a first portion of an encapsulation layer overlapping a pixel defining layer in which an opening exposing a portion of the upper surface of the pixel electrode is defined, and continuously extending in an area excluding the opening may be relatively smaller than a thickness of a second portion of the encapsulation layer overlapping a light emitting layer. In this example, when impurities, moisture, external air, and the like may penetrate the pixel defining layer, a defect in a display device may occur.

In the display device DD according to an embodiment of the invention, the pixel defining layer PDL may cover the edge of each of the first, second, and third pixel electrodes PE1, PE2, and PE3, and may continuously extend along at least two sub-pixel areas among the first, second, and third sub-pixel areas SPA1, SPA2, and SPA3. In such an embodiment, the peripheral opening POP overlapping the non-pixel area NPA may be defined in the pixel defining layer PDL and the peripheral opening POP may continuously extend between the first, second, and third sub-pixel areas SPA1, SPA2, and SPA3. In such an embodiment, the thickness of the encapsulation layer 160 overlapping the peripheral opening POP may be relatively thick. Accordingly, defects of the display device DD due to penetration of impurities, moisture, external air, and the like may be effectively prevented.

However, embodiments where the display device DD is an organic light emitting display device ("OLED") is described above in detail, the configuration of embodiments of the invention is not limited thereto. In alternative embodiments, the display device DD may be a liquid crystal display ("LCD") device, a field emission display ("FED") device, a plasma display (PDP) device, an electrophoretic display ("EPD") device, an inorganic light emitting display ("ILED") device, or a quantum dot display device.

FIGS. 5, 6, 7, 8, 9, 10, 11, 12, 13, 14, and 15 are cross-sectional views illustrating a method of manufacturing the display device of FIGS. 3 and 4.

Figure 5:
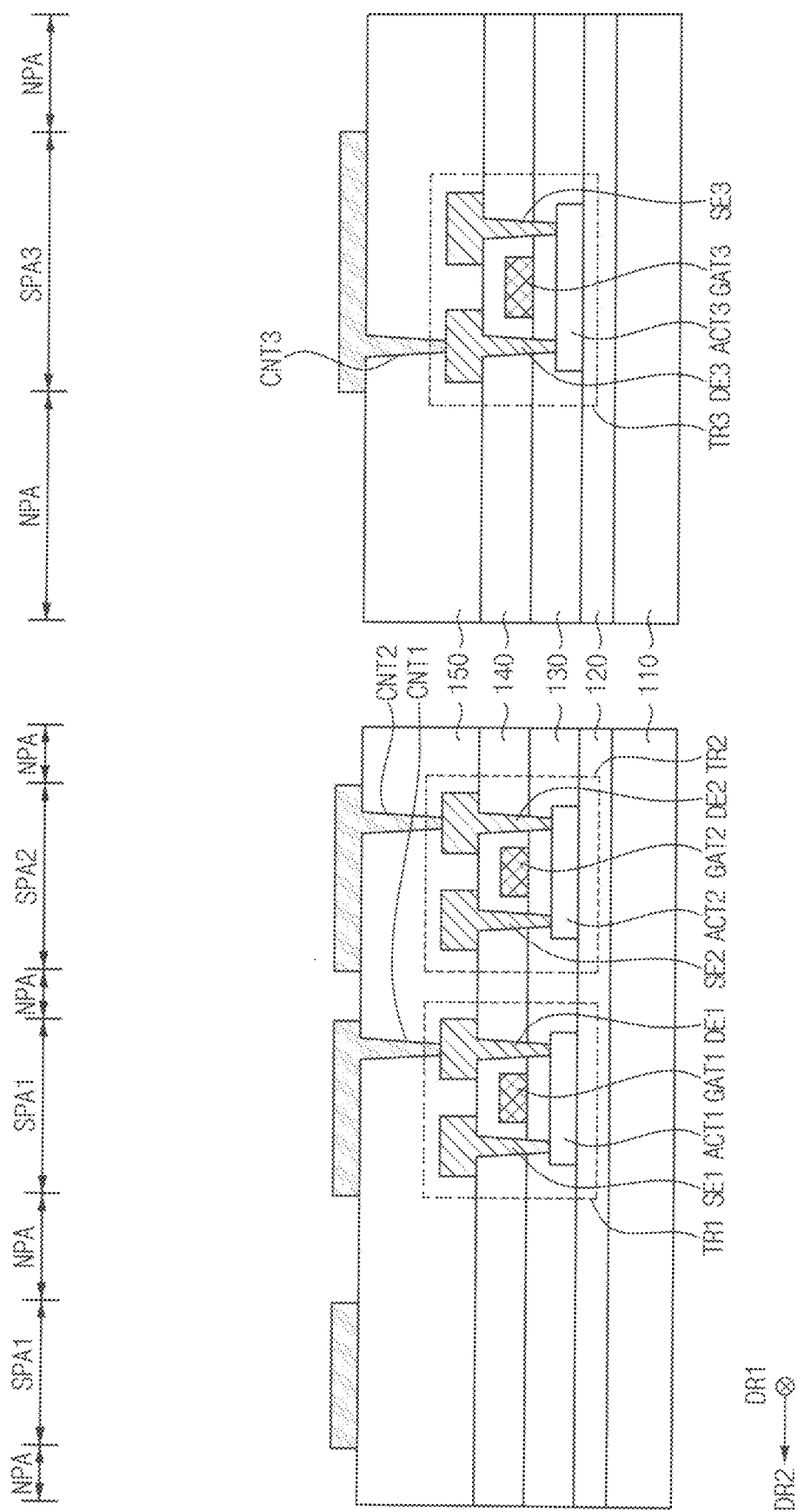
FIGS. 5, 6, 7, 8, 9, 10, 11, 12, 13, 14, and 15 are cross-sectional views illustrating a method of manufacturing the display device of FIGS. 3 and 4.
Figure 6:
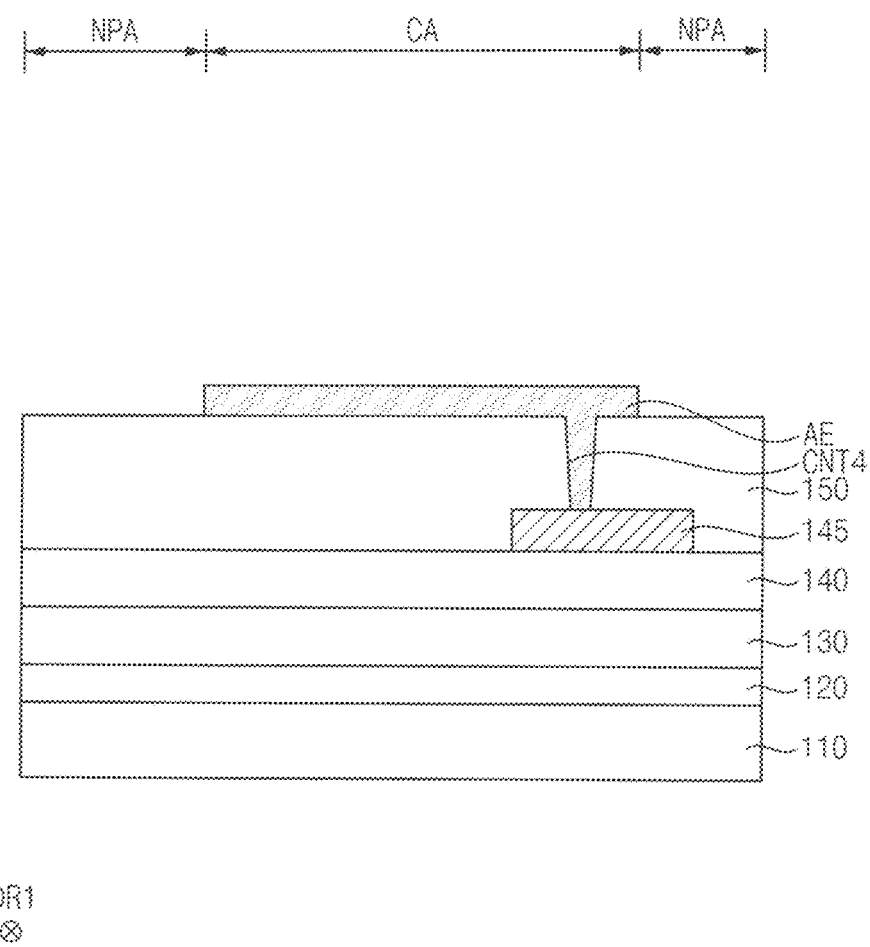

Referring to FIGS. 5 and 6, the buffer layer 120 may be provided or formed on the substrate 110 including a transparent material or an opaque material. In an embodiment, for example, the buffer layer 120 may be formed using an inorganic material such as silicon oxide, silicon nitride, silicon oxynitride, or the like.

The first, second, and third active layers ACT1, ACT2, and ACT3 may be formed on the buffer layer 120. Each of the first, second, and third active layers ACT1, ACT2, and ACT3 may include a metal oxide semiconductor, an inorganic semiconductor, or an organic semiconductor. The first, second, and third active layers ACT1, ACT2, and ACT3 may be simultaneously formed using a same material as each other. In an embodiment, for example, each of the first, second, and third active layers ACT1, ACT2, and ACT3 may include a source region, a drain region, and a channel region positioned between the source region and the drain region.

The gate insulating layer 130 may be provided or formed on the buffer layer 120. The gate insulating layer 130 may cover the first, second, and third active layers ACT1, ACT2, and ACT3. In an embodiment, for example, the gate insulating layer 130 may be formed using an inorganic material such as silicon oxide, silicon nitride, or the like.

The first, second, and third gate electrodes GAT1, GAT2, and GAT3 may be provided or formed on the gate insulating layer 130. A gate electrode (e.g., the first gate electrode GAT1, the second gate electrode GAT2, or the third gate electrode GAT3) may be provided or formed to overlap the channel region of an active layer (e.g., the first active layer ACT1, the second active layer ACT2, or the third active layer ACT3). In an embodiment, for example, the first, second, and third gate electrodes GAT1, GAT2, and GAT3 may be formed using a metal, an alloy, a metal nitride, a conductive metal oxide, a transparent conductive material, or the like. The first, second, and third gate electrodes GAT1, GAT2, and GAT3 may be simultaneously formed using a same material as each other.

The interlayer insulating layer 140 may be provided or formed on the gate insulating layer 130. The interlayer insulating layer 140 may cover the first, second, and third gate electrodes GAT1, GAT2, and GAT3. In an embodiment, for example, the interlayer insulating layer 140 may be formed using an inorganic material such as silicon oxide, silicon nitride, or the like.

The first, second, and third source electrodes SE1, SE2, and SE3 may be provided or formed on the interlayer insulating layer 140. A source electrode (e.g., the first source electrode SE1, the second source electrode SE2, or the third source electrode SE3) may be connected the source region of the active layer (e.g., the first active layer ACT1, the second active layer ACT2, or the third active layer ACT3) through a contact hole formed by removing a portion of the gate insulating layer 130 and the interlayer insulating layer 140.

The first, second, and third drain electrodes DE1, DE2, and DE3 may be formed on the interlayer insulating layer 140. A drain electrode (e.g., the first drain electrode DE1, the second drain electrode DE2, or the third drain electrode DE3) may be connected the drain region of the active layer (e.g., the first active layer ACT1, the second active layer ACT2, or the third active layer ACT3) through a contact hole formed by removing a portion of the gate insulating layer 130 and the interlayer insulating layer 140.

In an embodiment, for example, each of the source electrode and the drain electrode may be formed using a metal, an alloy, a metal nitride, a conductive metal oxide, a transparent conductive material, or the like. The source electrode and the drain electrode may be simultaneously formed using a same material as each other.

The conductive pattern 145 may be formed in the contact area CA on the interlayer insulating layer 140. The conductive pattern 145 may be simultaneously formed using a same material as the source electrode and the drain electrode.

The planarization layer 150 may be provided or formed on the interlayer insulating layer 140. The planarization layer 150 may be provided or formed to sufficiently cover the first, second, and third source electrodes SE1, SE2, and SE3, the first, second, and third drain electrodes DE1, DE2, and DE3, and the conductive pattern 145. In an embodiment, for example, the planarization layer 150 may be formed using an organic material such as a phenol resin, a polyimide resin, a polyamide resin, or the like.

The first, second, and third pixel electrodes PE1, PE2, and PE3 may be provided or formed on the planarization layer 150. The first pixel electrode PE1 may be provided or formed in the first sub-pixel area SPA1, the second pixel electrode PE2 may be provided or formed in the second sub-pixel area SPA2, and the third pixel electrode PE3 may be formed in the third sub-pixel area SPA3. The first pixel electrode PE1 may be connected to the first drain electrode DE1 through a first contact hole CNT1 formed by removing a portion of the planarization layer 150, the second pixel electrode PE2 may be connected to the second drain electrode DE2 through a second contact hole CNT2 formed by removing a portion of the planarization layer 150, and the third pixel electrode PE3 may be connected to the third drain electrode DE3 through a third contact hole CNT3 formed by removing a portion of the planarization layer 150. The first, second, and third pixel electrodes PE1, PE2, and PE3 may be simultaneously formed using a same material as each other.

The auxiliary electrode AE may be provided or formed in the contact area CA on the planarization layer 150. The auxiliary electrode AE may be connected to the conductive pattern 145 through the fourth contact hole CNT4 formed by removing a portion of the planarization layer 150. The auxiliary electrode AE may be simultaneously formed using a same material as the first, second, and third pixel electrodes PE1, PE2, and PE3.

Figure 7:
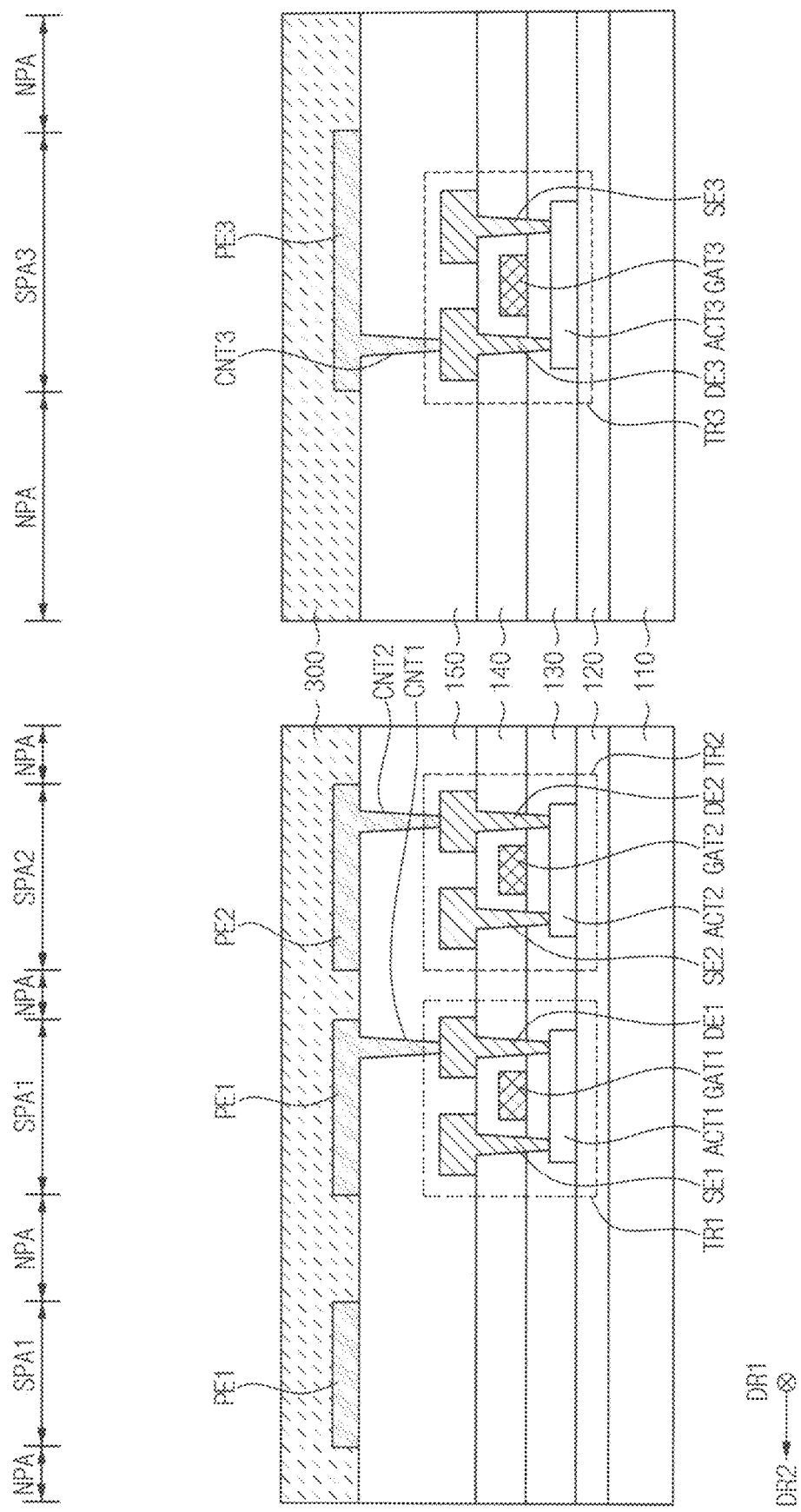
Figure 8:
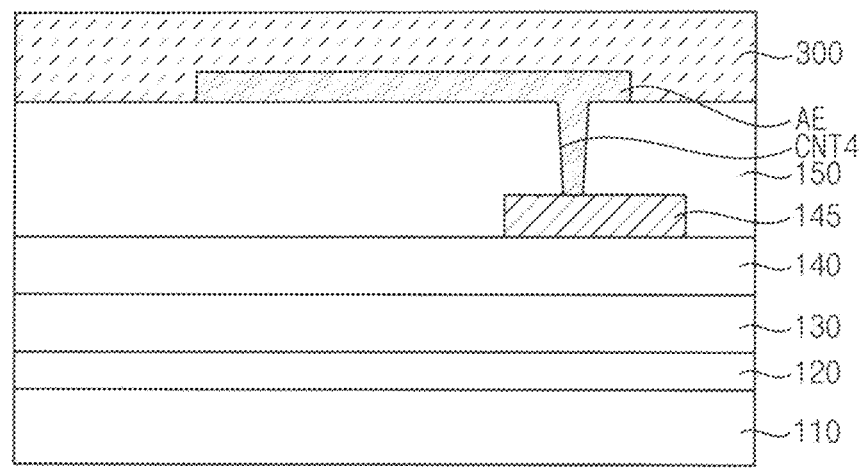

Referring FIGS. 7 and 8, the insulating layer 300 may be provided or formed on the planarization layer 150. The insulating layer 300 may be entirely formed in the pixel area PA, the contact area CA, and the non-pixel area NPA. In an embodiment, for example, the insulating layer 300 may be formed using an organic material. Alternatively, the insulating layer 300 may be formed using an organic material including a light blocking material such as a black pigment, a black dye, and the like.

Figure 9:
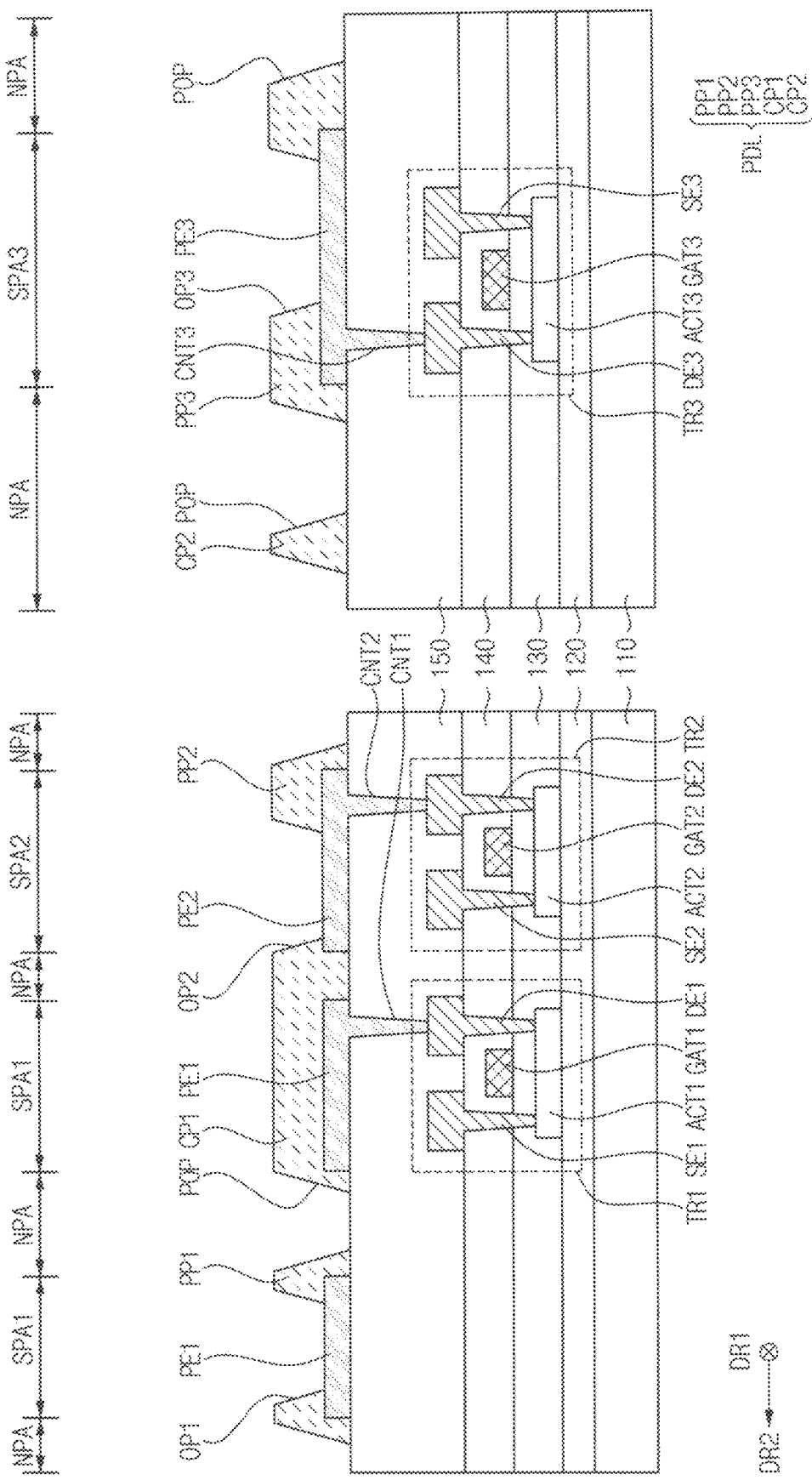
Figure 10:
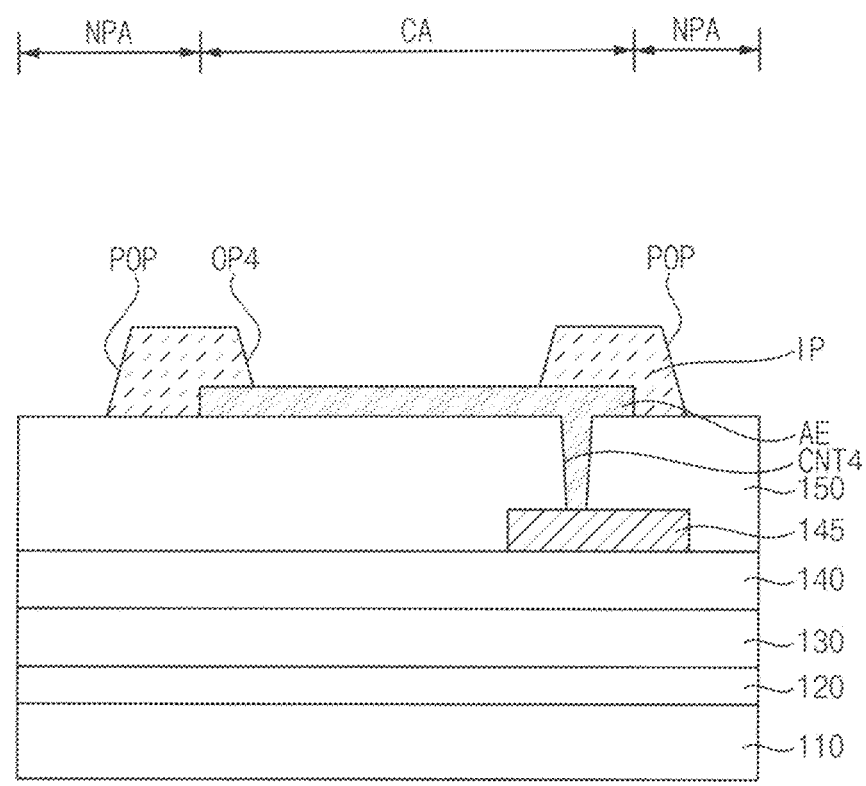

Referring FIGS. 9 and 10, by performing an etching process on the insulating film 300, the pixel defining layer PDL partially overlapping each of the first, second, and third sub-pixel areas SPA1, SPA2, and SPA3 and the insulating pattern IP partially overlapping the contact area CA may be formed. Here, through the etching process, the first opening OP1 exposing a portion of the upper surface of the first pixel electrode PE1, the second opening OP2 exposing a portion of the upper surface of the second pixel electrode PE2, and the third opening OP3 exposing a portion of the upper surface of the third pixel electrode PE3 may be formed in the pixel defining layer PDL and the fourth opening OP4 exposing a portion of the upper surface of the auxiliary electrode AE may be formed in the insulating pattern IP. In addition, the peripheral opening POP exposing the upper surface of the planarization layer 150 may be formed in the pixel defining layer PDL and the insulating pattern IP in the non-pixel area NPA through the etching process.

Figure 11:
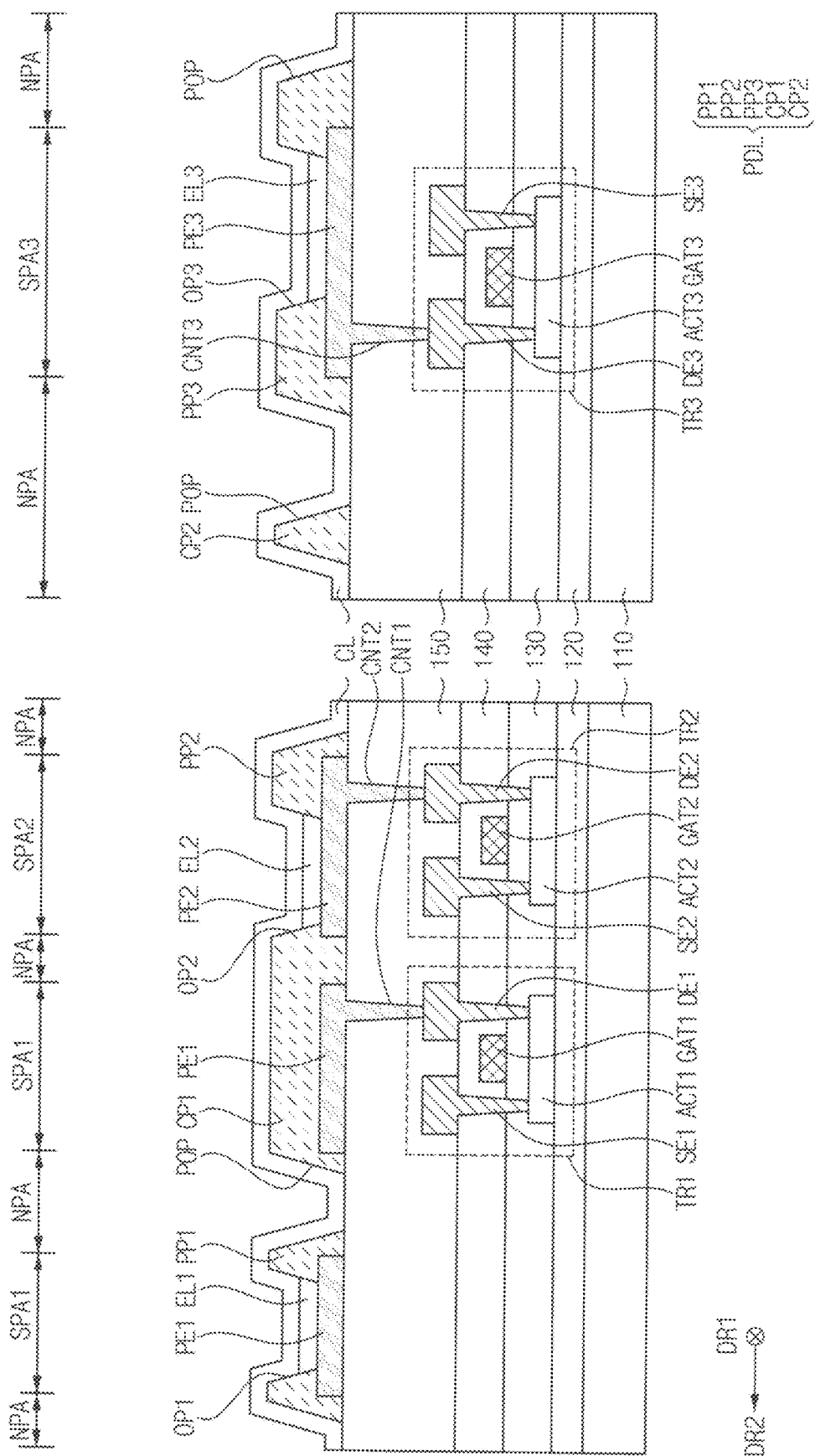
Figure 12:
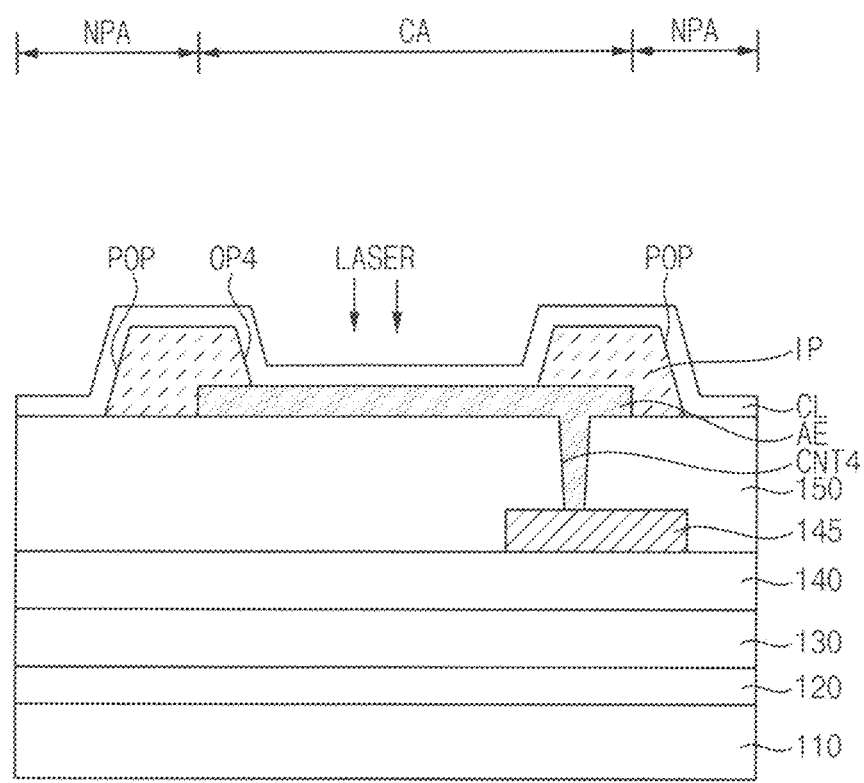
Figure 13:
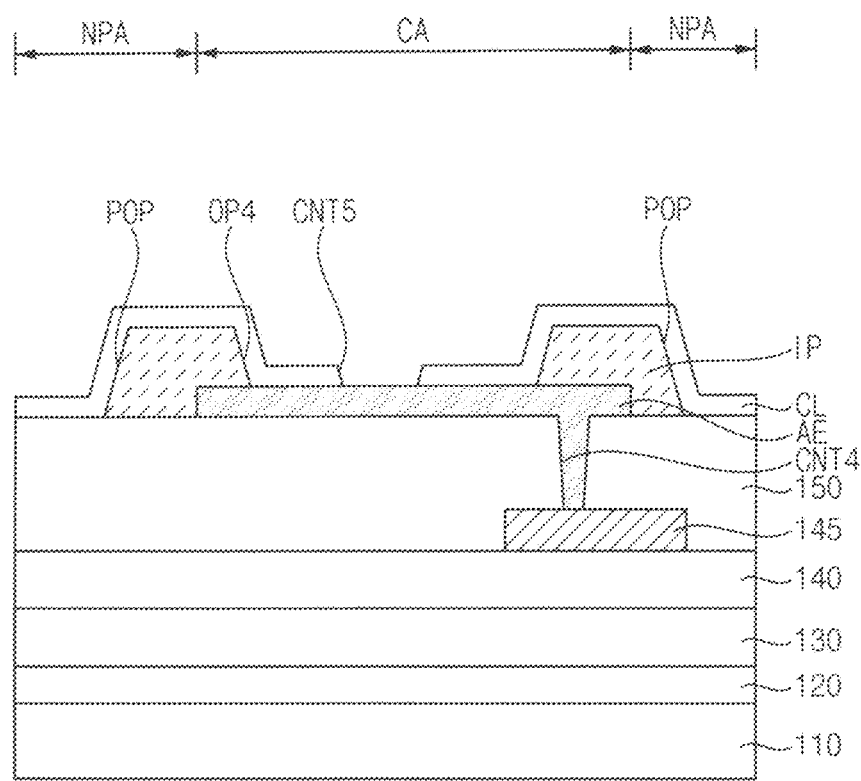

Referring FIGS. 11, 12 and 13, the first light emitting layer EL1 may be provided or formed on the first pixel electrode PE1, the second light emitting layer EL2 may be provided or formed on the second pixel electrode PE2, the third light emitting layer EL3 may be provided or formed on the third pixel electrode PE3. In an embodiment, for example, each of the first, second, and third light emitting layers EL1, EL2, and EL3 may be formed using a low molecular weight organic compound or a high molecular weight organic compound.

The common layer CL may be provided or formed on the planarization layer 150, the pixel defining layer PDL, the insulating pattern IP, the first light emitting layer EL1, the second light emitting layer EL2, and the third light emitting layer EL3. The common layer CL may continuously extend in the pixel area PA, the contact area CA, and the non-pixel area NPA. The common layer CL may include a hole injection layer, a hole transport layer, an electron transport layer, an electron injection layer, and the like.

The fifth contact hole CNTS exposing a portion of the upper surface of the auxiliary electrode AE by radiating a laser to the common layer CL in the contact area CA may be formed.

Figure 14:
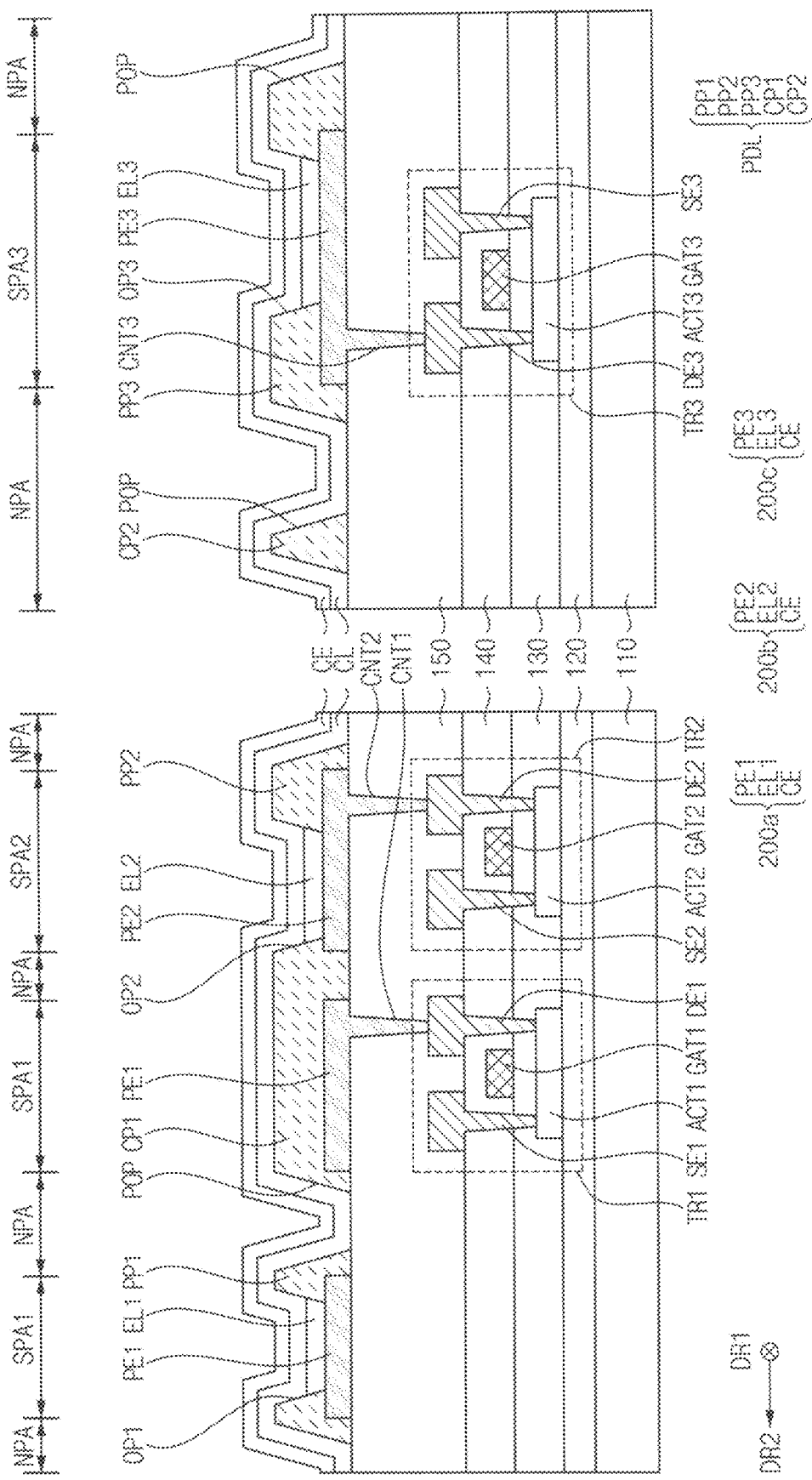
Figure 15:
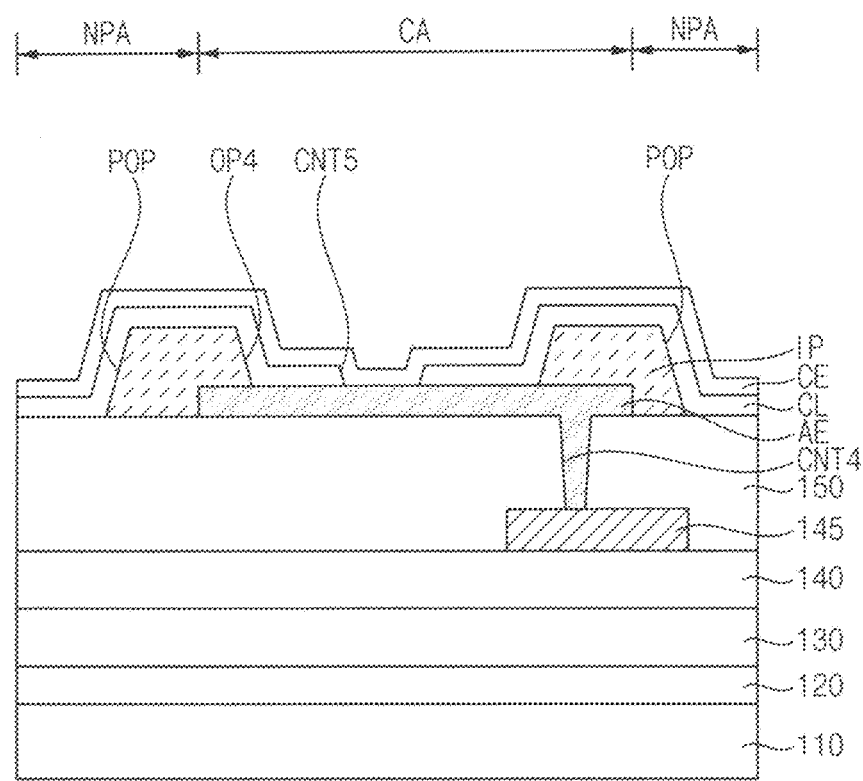

Referring FIGS. 14 and 15, the common electrode CE may be provided or formed on the common layer CL. The common electrode CE may continuously extend in the pixel area PA, the contact area CA, and the non-pixel area NPA. In the contact area CA, the common electrode CE may be connected to the auxiliary electrode AE through the fifth contact hole CNTS of the common layer CL. In an embodiment, for example, the common electrode CE may be formed using a metal, an alloy, a metal nitride, a conductive metal oxide, a transparent conductive material, or the like.

Referring back to FIGS. 3 and 4, the encapsulation layer 160 may be provided or formed on the common electrode CE. In an embodiment, for example, the encapsulation layer 160 may include at least one inorganic encapsulation layer and at least one organic encapsulation layer.

Accordingly, the display device DD illustrated in FIGS. 3 and 4 may be manufactured.

Figure 16:
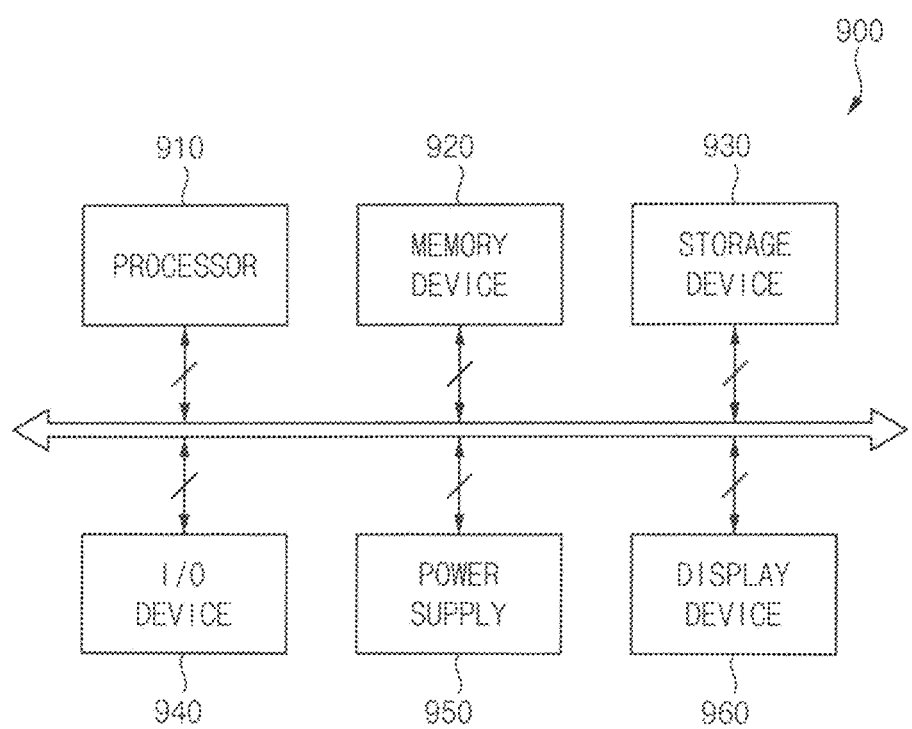
FIG. 16 is a block diagram illustrating an embodiment of an electronic device including the display device of FIG. 1.
Figure 17:
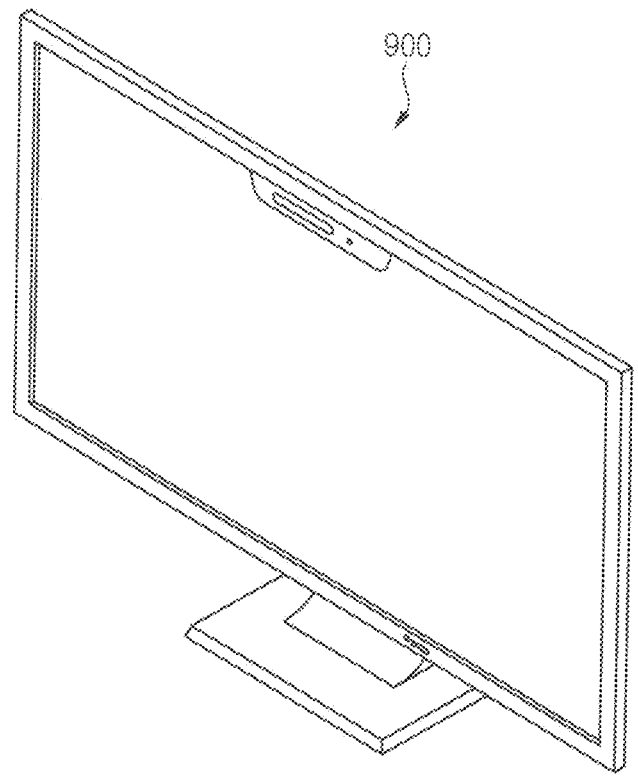
FIG. 17 is a diagram illustrating an embodiment in which the electronic device of FIG. 16 is implemented as a television.
Figure 18:
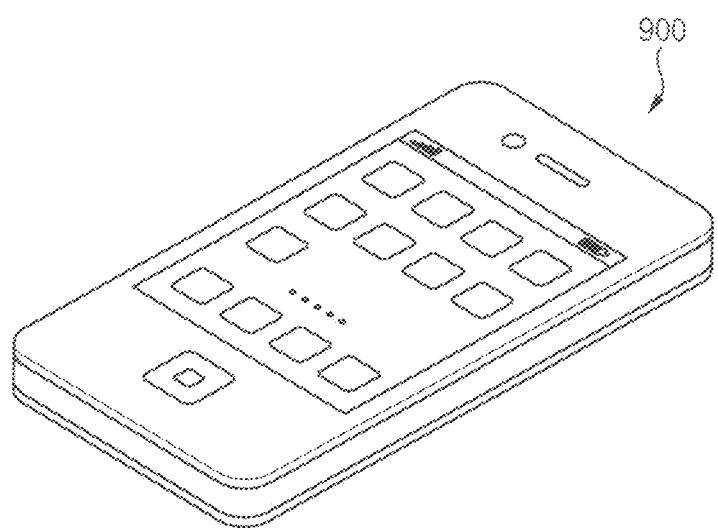
FIG. 18 is a diagram illustrating an embodiment in which the electronic device of FIG. 16 is implemented as a smartphone.

FIG. 16 is a block diagram illustrating an embodiment of an electronic device including the display device of FIG. 1. FIG. 17 is a diagram illustrating an embodiment in which the electronic device of FIG. 16 is implemented as a television. FIG. 18 is a diagram illustrating an embodiment in which the electronic device of FIG. 16 is implemented as a smartphone.

Referring to FIGS. 16, 17 and 18, in an embodiment, the electronic device 900 may include a processor 910, a memory device 920, a storage device 930, an input/output ("I/O") device 940, a power supply 950 and a display device 960. In this case, the display device 960 may correspond to an embodiment of the display device 100 described with reference to FIGS. 1, 2, 3, and 4. The electronic device 900 may further include various ports capable of communicating with a video card, a sound card, a memory card, a USB device, and the like.

In an embodiment, as illustrated in FIG. 17, the electronic device 900 may be implemented as a television. In an alternative embodiment, as illustrated in FIG. 18, the electronic device 900 may be implemented as a smart phone. However, embodiments are not limited thereto, in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like.

The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

Embodiments of the disclosure can be applied to various display devices. For example, embodiments o the disclosure is applicable to various display devices such as display devices for vehicles, ships and aircraft, portable communication devices, display devices for exhibition or information transmission, medical display devices, and the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate including a pixel area including a first sub-pixel area, a second sub-pixel area, and a third sub-pixel area, and a non-pixel area surrounding the pixel area;
   a first light emitting element including a first pixel electrode disposed in the first sub-pixel area on the substrate;
   a second light emitting element including a second pixel electrode disposed in the second sub-pixel area on the substrate;
   a third light emitting element including a third pixel electrode disposed in the third sub-pixel area on the substrate; and
   a pixel defining layer in which a peripheral opening overlapping the non-pixel area is defined to continuously extend along between the first, second, and third sub-pixel areas, wherein the pixel defining layer covers edges of each of the first, second, and third pixel electrodes on the substrate, and continuously extends along at least two adjacent sub-pixel areas among the first, second, and third sub-pixel areas.

2. The display device of claim 1, wherein the pixel area is provided in plural and repeatedly arranged in a first direction and a second direction intersecting the first direction.

3. The display device of claim 2, wherein the pixel defining layer includes:
a first pattern portion covering an edge of the first pixel electrode;
a second pattern portion covering an edge of the second pixel electrode;
a third pattern portion covering an edge of the third pixel electrode;
a first connection portion covering a portion of the first pixel electrode and connected between the first, second, and third pattern portions positioned in one pixel area; and
a second connection portion connected between the first pattern portion positioned in a first pixel area and the third pattern portion in a second pixel area adjacent to the first pixel area, and connected between the third pattern portion positioned in the second pixel area and the second pattern portion positioned in the second pixel area.

4. The display device of claim 3, wherein a width of the second connection portion is smaller than a width of each of the first, second, and third pattern portions.

5. The display device of claim 1, wherein an opening exposing a portion of an upper surface of each of the first, second, and third pixel electrodes is further defined in the pixel defining layer.

6. The display device of claim 1, wherein the pixel defining layer includes an inorganic material or an organic material.

7. The display device of claim 1, further comprising:
a first transistor disposed in the first sub-pixel area on the substrate and including a first drain electrode connected to the first pixel electrode;
a second transistor disposed in the second sub-pixel area on the substrate and including a second drain electrode connected to the second pixel electrode; and
a third transistor disposed in the third sub-pixel area on the substrate and including a third drain electrode connected to the third pixel electrode.

8. The display device of claim 7, wherein the substrate further includes a contact area adjacent to the pixel area.

9. The display device of claim 8, further comprising:
a conductive pattern disposed in the contact area on the substrate and including a same material as the first, second, and third drain electrodes; and
an auxiliary electrode connected to the conductive pattern and including a same material as the first, second, and third pixel electrodes.

10. The display device of claim 9, further comprising:
an insulating pattern disposed in the contact area on the conductive pattern, in which an opening exposing a portion of an upper surface of the auxiliary electrode is defined,
wherein the insulating pattern includes a same material as the pixel defining layer.

11. The display device of claim 10, wherein the peripheral opening overlapping the non-pixel area is further defined in the insulating pattern, and
wherein the peripheral opening continuously extends between the first, second, and third sub-pixel areas and the contact area.

12. The display device of claim 10, wherein the insulating pattern is spaced apart from the pixel defining layer.

13. The display device of claim 10, wherein the insulating pattern has an island shape in a plan view.

14. The display device of claim 10, wherein the insulating pattern covers an edge of the auxiliary electrode.

15. The display device of claim 10, further comprising:
a planarization layer covering the first, second, and third drain electrodes under the first, second, and third pixel electrodes, and covering the conductive pattern under the auxiliary electrode,
wherein the peripheral opening exposes an upper surface of the planarization layer.

16. The display device of claim 15, further comprising:
a common layer disposed on the planarization layer and covering the pixel defining layer and the insulating pattern,
wherein the each of the first, second, and third light emitting element further includes:
a common electrode disposed entirely on the common layer and connected to the auxiliary electrode through a contact hole defined in the common layer in the contact area.

17. A display device comprising:
a substrate including a pixel area including a first sub-pixel area, a second sub-pixel area, and a third sub-pixel area, which emit light of different colors from each other, a contact area adjacent to the pixel area, and a non-pixel area surrounding the pixel area and the contact area;
a planarization layer disposed on the substrate;
a first light emitting element including a first pixel electrode disposed in the first sub-pixel area on the planarization layer;
a second light emitting element including a second pixel electrode disposed in the second sub-pixel area on the planarization layer;
a third light emitting element including a third pixel electrode disposed in the third sub-pixel area on the planarization layer; and
a pixel defining layer in which a peripheral opening exposing an upper surface of the planarization layer in the non-pixel area is defined to continuously extend along at least two adjacent sub-pixel areas among the first, second, and third sub-pixel areas on the planarization layer.

18. The display device of claim 17, wherein the pixel area is provided in plural and repeatedly arranged in a first direction and a second direction intersecting the first direction.

19. The display device of claim 18, wherein the pixel defining layer includes:
a first pattern portion covering an edge of the first pixel electrode;
a second pattern portion covering an edge of the second pixel electrode;
a third pattern portion covering an edge of the third pixel electrode;
a first connection portion covering a portion of the first pixel electrode and connected between the first, second, and third pattern portions positioned in one pixel area; and
a second connection portion connected between the first pattern portion positioned in a first pixel area and the third pattern portion in a second pixel area adjacent to the first pixel area, and connected between the third pattern portion positioned in the second pixel area and the second pattern portion positioned in the second pixel area.

20. The display device of claim 17, wherein the contact area is an area on which one of a laser drilling process, an organic film taper adjustment process, and an organic film reverse taper adjustment process is performed.

* * * * *